United States Patent
Smith et al.

(10) Patent No.: US 7,154,352 B2
(45) Date of Patent: Dec. 26, 2006

(54) CLOCK GENERATOR AND RELATED BIASING CIRCUIT

(75) Inventors: Sterling Smith, Hsinchu (TW); Horng-Der Chang, Hua-Lien (TW)

(73) Assignee: MStar Semiconductor, Inc., Hsin-Chu Hsien (TW)

(*) Notice: Subject to any disclaimer, the term of this patent is extended or adjusted under 35 U.S.C. 154(b) by 45 days.

(21) Appl. No.: 10/904,269

(22) Filed: Nov. 2, 2004

(65) Prior Publication Data

US 2005/0093634 A1    May 5, 2005

Related U.S. Application Data

(60) Provisional application No. 60/517,076, filed on Nov. 5, 2003.

(51) Int. Cl.
 *H03L 1/00* (2006.01)
(52) U.S. Cl. .................. 331/185; 331/186; 331/57

(58) Field of Classification Search ............... 331/57, 331/185, 186; 327/539; 323/313
See application file for complete search history.

(56) References Cited

U.S. PATENT DOCUMENTS 6,803,833 B1* 10/2004 Yen et al. ............... 331/175
2004/0245975 A1* 12/2004 Tran et al. ............... 323/313

* cited by examiner

*Primary Examiner*—Joseph Chang
(74) *Attorney, Agent, or Firm*—Winston Hsu

(57) ABSTRACT

A clock generator capable of providing reduced low-frequency jitter clock signals without utilization of a crystal oscillator is introduced. The present invention clock generator utilizes a diode in related biasing circuit such that the generated control current to a current control oscillator is stable and clear due to the low flicker noise and low thermal noise of the voltage across the diode. The cost of PLL systems utilizing the present invention clock generator instead of a crystal oscillator is decreased. The adopted biasing circuit is introduced as well.

14 Claims, 3 Drawing Sheets

CLOCK GENERATOR AND RELATED BIASING CIRCUIT

CROSS REFERENCE TO RELATED APPLICATIONS

The application claims the benefit of U.S. Provisional Application No. 60/517,076, filed Nov. 5, 2003, and included herein by reference.

BACKGROUND OF INVENTION

1. Field of the Invention

The present invention generally relates to a clock generator and a biasing circuit adopted in the clock generator. More specifically, the present invention relates to a clock generator that provides stable clock signals without utilizing a crystal oscillator.

2. Description of the Prior Art

It is very important to provide stable clock signals in signal processing systems. Please refer to FIG. 1. FIG. 1 shows a block diagram of a prior art analog phase-locked loop 100. The analog phase-locked loop (PLL) 100 includes a crystal oscillator (XO) 110, a frequency divider 120, a phase-frequency detector (PFD) 130, a charge pump 140, a loop filter 150 and a voltage-controlled oscillator (VCO) 160. The analog PLL 100 utilizes the frequency divider 120 to divide oscillator signals $F_{VCO}$ output by the VCO 160 by a multiple, and evaluates the differences of phase and frequency between the output signals from the frequency divider 120 and the reference clock signals $F_{ref}$ generated from the crystal oscillator 110 by using the PFD 130, so as to generate difference signals. The charge pump 140 charges the loop filter 150 according to the difference signals, and the loop filter 150 generates a control voltage $V_c$ accordingly. The VCO 160 outputs an oscillation signal $F_{VCO}$ corresponding to the control voltage $V_c$. In this manner, the PLL 100 can provide stable clock signals with the aid of the stable reference clock signals $F_{ref}$ generated from the crystal oscillator 110, and can change the frequency of output oscillation signals by varying the frequency-dividing multiple of the frequency divider 120. There are PLLs of different structures, including digital ones. However, in every kind of PLL, for providing an accurate reference clock signal, the crystal oscillator cannot be replaced with any other common clock generator. There are many kinds of oscillators. However, crystal oscillators of high accuracy and low noise are expensive. No matter what category of the oscillator is utilized, the cost of the oscillator is usually the significant part of the cost of the total PLL. Hence the effect of decreasing cost by simplifying or changing components other than the crystal oscillator is quite limited. Still, utilizing oscillators other than crystal oscillators results in jitter generated by the flicker noise and thermal noise of the oscillation signals, which locate at low frequencies. In video signal systems, the problem of jitter at low frequency is more serious since the jitter locates around the frequency of HSYNC signals.

SUMMARY OF INVENTION

It is therefore a primary objective of the present invention to provide a clock generator and a biasing circuit.

Briefly described, the claimed invention disclosed a clock generator. The clock generator includes a current controlled oscillator (ICO) having an input for receiving a control current, and an output for outputting clock signals of a frequency according to the control current; and a biasing circuit electrically connected to the ICO. The biasing circuit includes a controlled current generator having a first current output coupled to the input of the ICO for outputting the control current, and a second current output copying the first current output with a predetermined ratio; a resistor having one end coupled to the second current output of the controlled current generator; an operational amplifier (opamp) having a first input coupled to the second current output of the controlled current generator, a second input, and an output coupled to the controlled current generator; a diode having an end coupled to the second input of the opamp; and a current source having a first end coupled to the end of the diode and a second end coupled to the output of the opamp.

The claimed invention further disclosed a biasing circuit. The biasing circuit includes a controlled current generator having a first current output for outputting a control current, and a second current output copying the first current output with a predetermined ratio; a resistor having one end coupled to the second current output of the controlled current generator; an operational amplifier (opamp) having a first input coupled to the second current output of the controlled current generator, a second input, and an output coupled to the controlled current generator; a diode having an end coupled to the second input of the opamp; and a current source having a first end coupled to the end of the diode and a second end coupled to the output of the opamp.

It is an advantage of the present invention that the clock generator utilizes a biasing circuit for decreasing jitter of the utilized ICO. Hence the present invention clock generator does not have to utilize a crystal oscillator. Therefore the cost is reduced.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a clock generator including a common current-controlled oscillator (ICO) and a biasing circuit for providing reduced low-frequency jitter reference clock signals without the aid of any crystal oscillators. Conventionally, no matter of what structure the PLL is, a crystal is necessary for providing stable reference clock signals and hence generating an accurate and reduced low-frequency jitter output oscillation signals accordingly. However, in the present invention, the claimed clock generator and its adopted biasing circuit decrease the low-frequency jitter noise of the output reference clock signal. Hence the crystal oscillator can be replaced, and the cost is decreased in consequence.

Figure 1:
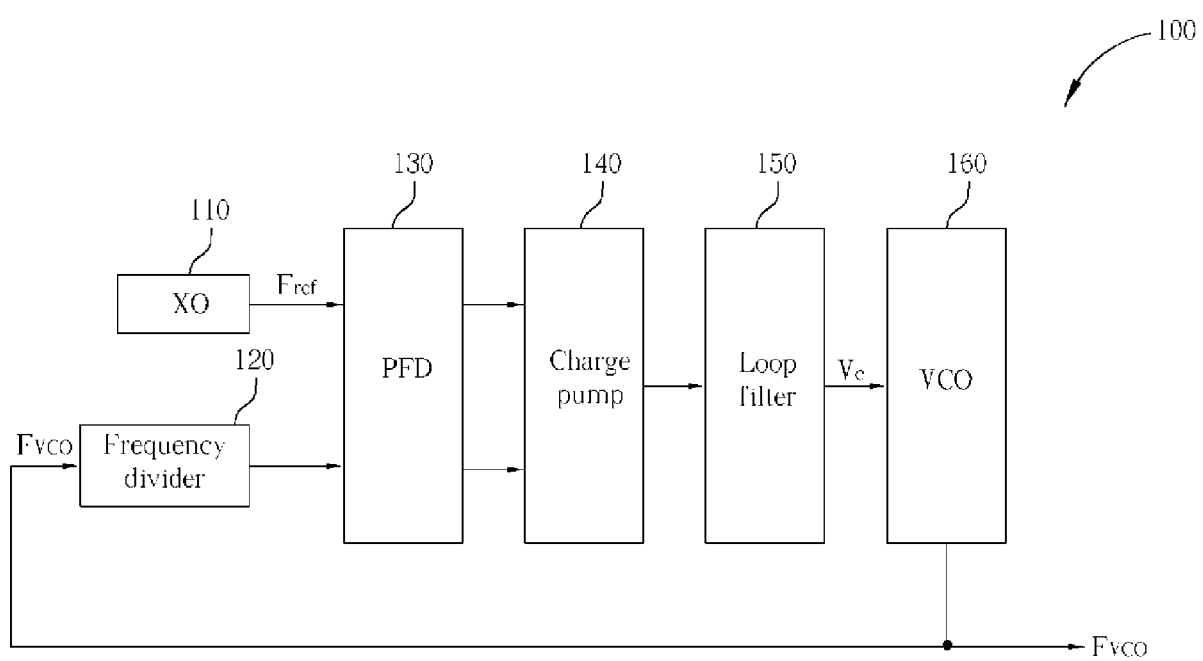
FIG. 1 is a block diagram of a prior art analog phase-locked loop.
Figure 2:
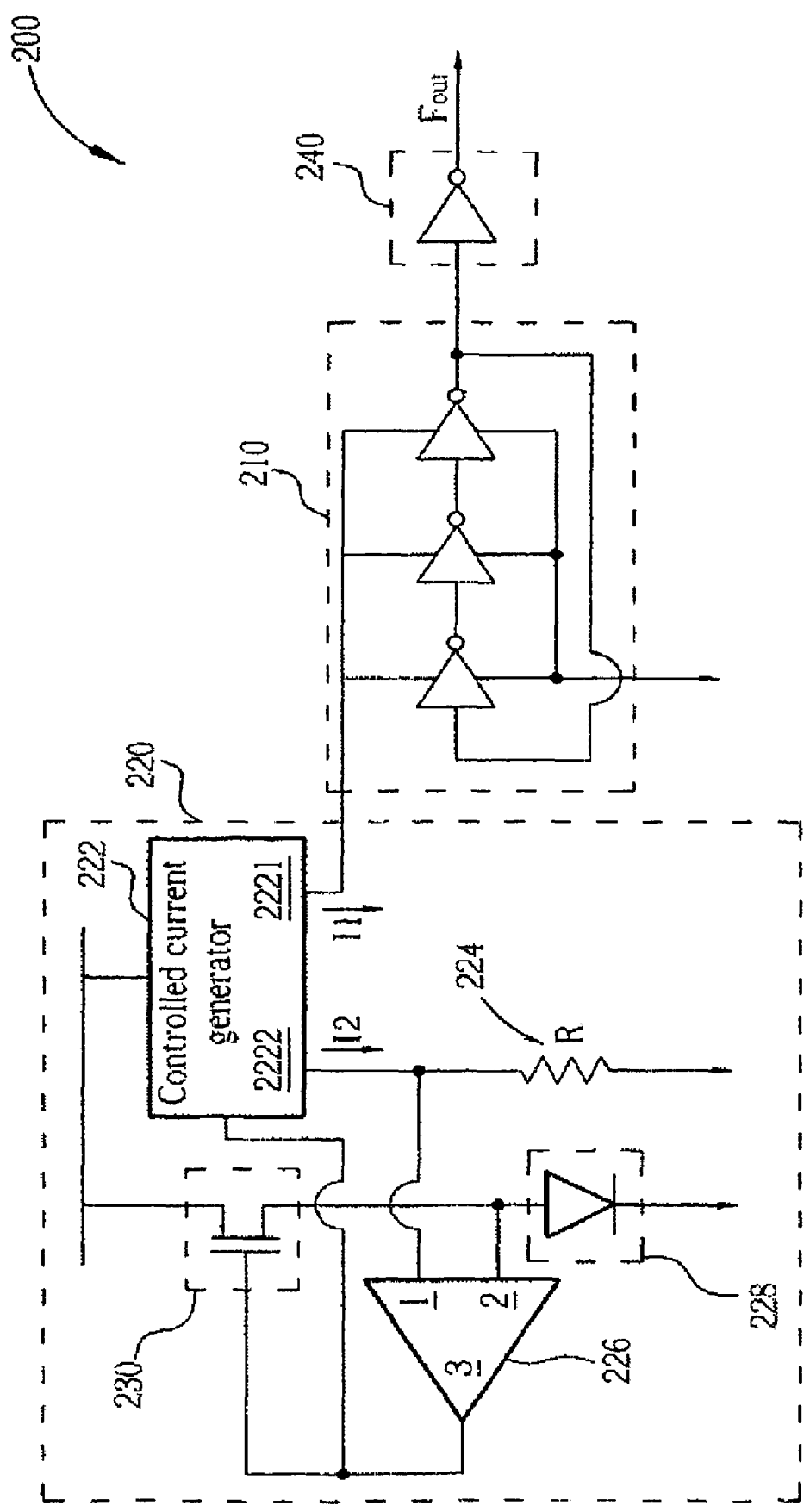
FIG. 2 is a block diagram of an embodiment of the present invention clock generator.

The reason that the reference clock signals have to be generated by a crystal oscillator is that the current and voltages in most real circuits are inherently imprecise and unclear. For example, reference voltages generated by band-gap voltage generator commonly exhibit offset errors of up to 7% and high jitter noise as well. The high jitter effect results in an unacceptable error in final output oscillation signals if being utilized to control an oscillator for generating clock signals. Please refer to FIG. 2. FIG. 2 is a block diagram of the present invention clock generator 200. The present invention clock generator 200 includes a current-controlled oscillator (ICO) 210 capable of generating clock signals according to input control current and a biasing circuit 220. The biasing circuit 220 comprises a controlled current generator 222, a resistor 224 coupled to the controlled current generator 222, an operational amplifier (opamp) 226, a current source 230, and a diode 228 coupled to the current source 230. The controlled current generator 222 has a first current output 2221 coupled to the input of the ICO 210 for outputting a first output current I1 as the control current of the ICO 210, and a second current output 2222 for outputting a second output current I2 copying the first output current I1 with a predetermined ratio, say, I2=K*I1. The opamp 226 has a first output 1 coupled to the second current output 2222 of the controlled current generator 222, a second input 2 coupled to the diode 228, and an output 3 coupled to the controlled current generator and a gate of the current source 230. The diode could be made of a parasitic bipolar transistor in a MOS semiconductor device to facilitate fabrication of the circuit in a low-cost CMOS process technology. The voltage potential across the diode 228 is a stable and known value, say. $V_{be}$, depending on the circuit design. According to the physical nature of the diode 228, the flicker noise and thermal noise of $V_{be}$ are small compared to the flicker and thermal noise of reference voltages generated by bandgap circuits. The opamp 226 forms a closed loop, forcing the voltage potentials at the first input 1 and the second input 2 of the opamp 226 to be nearly equal. Since substantially all of the current from the current source 230 flows through the diode 228 and substantially all of the second current I2 flows through the resistor 224, the current flowing in resistor 224 is forced to be $V_{be}/R$. Since the relationship between the first current I1 and the second current I2 is predetermined and fixed as aforementioned, the value of the first current I1 is $k*V_{be}/R$ in consequence. Since the currents I1 and I2 are copied currents, the first current I1 has similar low noise characteristics as the second current I2. Hence the output clock signals of the ICO 210 and further output signals $F_{out}$ of the inverter (or buffer) 240 have reduced jitter compared to other ICOs controlled by bandgap derived voltages or currents.

The present invention biasing circuit utilizes the nature of low noise of the diode to provide a suitable control current. In the embodiment illustrated in FIG. 2, the diode 228 can be formed by a parasitic bipolar in a CMOS circuit. Further, the current source 230 is implemented by a P-type metal-oxide semiconductor (PMOS), and the output of the opamp 226 is coupled to the gate of the adopted PMOS. In fact, the current source 230 can be implemented in other ways as long as it can provide sufficient current to the diode 228 and form a closed loop together with the opamp 226. The controlled current generator 222 can be implemented in many ways as well. The ICO 210 demonstrated in FIG. 2 is a ring oscillator. Similarly, other types of ICOs can be utilized in the present invention to provide clock signals with the stable and clear control current generated from the claimed biasing circuit.

Figure 3:
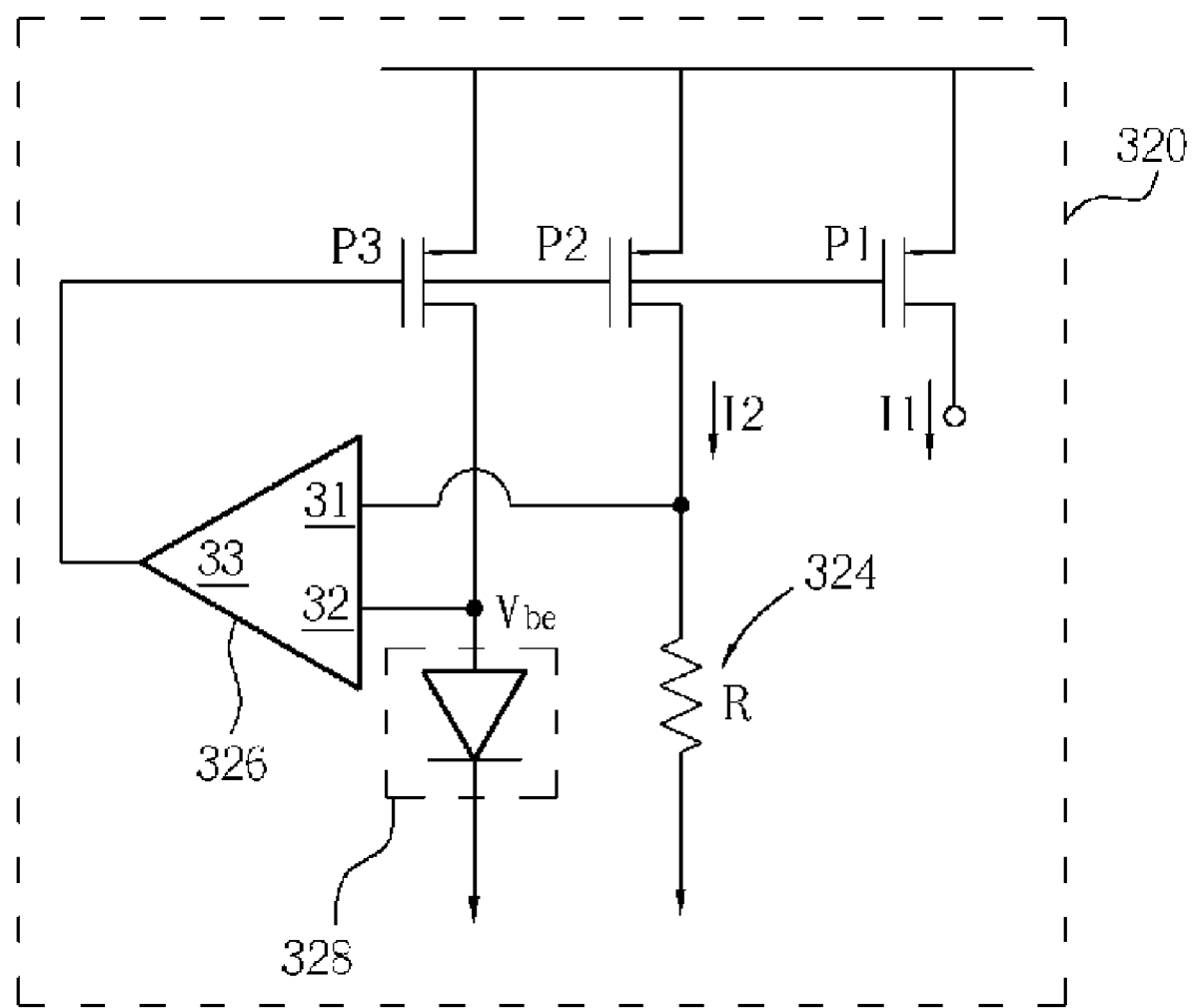
FIG. 3 is a block diagram of an embodiment of the present invention biasing circuit.

Please refer to FIG. 3. FIG. 3 is a block diagram of an embodiment of the present invention biasing circuit 320. P1, P2 and P3 are three PMOS transistors. P1 and P2 constitute a pair of current sources, outputting currents I1 and I2 wherein the current I1 copies the current I2. The sources of P1 and the source of P2 are coupled to a voltage source. The drain of P1 generates the first current output of the controlled current generator. The drain of P2 is coupled to the first input 31 of the opamp 326 and the resistor 324. The gates of P1, P2 and P3 are all coupled to the output 33 of the opamp 326. P3 behaves as a current source providing current to the diode 328. The opamp 326 forms a closed-loop such that the voltage potentials at two inputs 31 and 32 of the opamp 326 are forced to be nearly equal. Therefore, the current I2 flowing in the resistor 324 is $V_{be}/R$, and the current I1 is $K*V_{be}/R$ with the same assumption as the controlled current generator 222 in FIG. 2. As shown in FIG. 3, three current sources of P1, P2 and P3 are controlled by opamp 326. Substantially all of the current from the current source P3 flows through the diode 328 and substantially all of the second current I2 from PMOS P2 flows through the resistor 324. As aforementioned, the current I1 can have reduced noise due to the low noise nature of the diode 328. The structure of the embodiment of the claimed biasing circuit 320 illustrated in FIG. 3 is quite concise. Nevertheless, any modification to the disclosed circuit that can perform equivalent tasks is preferred and should be within the scope of the claimed invention as well.

The present invention discloses a clock generator capable of providing reduced low-frequency jitter clock signals to meet the requirement of PLL circuits in signal processing systems without utilization of crystal oscillators to reduce the cost. In video signal processing systems, the accuracy of sampling clocks and signal processing clocks is even more important for the visual performance relies on it. The claimed clock generator utilizes a diode hence the flicker noise and thermal noise of final output oscillation signals are reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generator comprising:
   a current controlled oscillator (ICO) having an input for receiving a control current, and an output for outputting clock signals of a frequency according to the control current; and
   a biasing circuit electrically connected to the ICO comprising:
      a controlled current generator having a first current output coupled to the input of the ICO for outputting the control current, and a second current output copying the first current output with a predetermined ratio;
      a resistor having one end coupled to the second current output of the controlled current generator;
      an operational amplifier (opamp) having a first input coupled to the second current output of the controlled current generator, a second input, and an output coupled to the controlled current generator;
      a diode having an end coupled to the second input of the opamp; and
      a current source having a first end coupled to the end of the diode and a second end coupled to the output of the opamp,
   wherein substantially all of the current from the current source flows through the diode and substantially all of the current from second current output flows through the resistor.

2. The clock generator of claim 1 further comprising an inverter coupled to the output of the ICO.

3. The clock generator of claim 1 further comprising a buffer coupled to the output of the ICO.

4. The clock generator of claim 1 wherein the controlled current generator comprises:
   a first PMOS comprising:
      a source coupled to a voltage source;
      a drain coupled to the input of the ICO; and
      a gate coupled to the output of the opamp; and
   a second PMOS comprising
      a source coupled to the voltage source;
      a drain coupled to the first input of the opamp; and
      a gate coupled to the output of the opamp.

5. The clock generator of claim 1 wherein the current source is a PMOS, the first end of the current source being a drain of the PMOS, the second end of the current source being a gate of the PMOS.

6. The clock generator of claim 1 wherein the ICO is a ring oscillator.

7. The clock generator of claim 1 wherein the diode is a parasitic bipolar.

8. The clock generator of claim 1 wherein the first current output of the controlled current generator is substantially equal to the second current output of the controlled current generator with reduced low-frequency jitter.

9. A biasing circuit for controlling a current oscillator, the biasing circuit comprising:
   a controlled current generator having a first current output for outputting a control current, and a second current output copying the first current output with a predetermined ratio;
   a resistor having a first end coupled to the second current output of the controlled current generator, and a second end coupled to a first voltage;
   an operational amplifier (opamp) having a first input coupled to the second current output of the controlled current generator, a second input, and an output electrically coupled to the controlled current generator;
   a diode having a first end coupled to the second input of the opamp, and a second end coupled to said first voltage; and
   a current source having a first end coupled to the end of the diode, a second end coupled to the output of the opamp, and a third end coupled to a second voltage, wherein substantially all of the current from the current source flows through the diode and substantially all of the current from second current output flows through the resistor.

10. The biasing circuit of claim 9 wherein the controlled current generator comprises:
   a first PMOS comprising:
      a source coupled to said second voltage;
      a drain for outputting the control current; and
      a gate coupled to the output of the opamp; and
   a second PMOS comprising
      a source coupled to said second voltage;
      a drain coupled to the first input of the opamp; and
      a gate coupled to the output of the opamp.

11. The biasing circuit of claim 9 wherein the current source is a PMOS, the first end of the current source being a drain of the PMOS, the second end of the current source being a gate of the PMOS, the third end of the current source being a source of the PMOS.

12. The biasing circuit of claim 9 wherein the diode is a parasitic bipolar.

13. The biasing circuit of claim 9 wherein said second voltage is higher than said first voltage.

14. The biasing circuit of claim 9 wherein said first voltage is ground.

* * * * *